United States Patent
Shur et al.

(10) Patent No.: US 9,230,680 B2
(45) Date of Patent: *Jan. 5, 2016

(54) APPLICATIONS FOR INTER-WORD-LINE PROGRAMMING

(71) Applicant: Apple Inc., Cupertino, CA (US)

(72) Inventors: Yael Shur, Tel Aviv (IL); Yoav Kasorla, Kfar Netar (IL); Eyal Gurgi, Petah-Tikva (IL)

(73) Assignee: Apple Inc., Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/450,903

(22) Filed: Aug. 4, 2014

(65) Prior Publication Data

US 2014/0340951 A1    Nov. 20, 2014

Related U.S. Application Data (63) Continuation of application No. 13/709,303, filed on Dec. 10, 2012, now Pat. No. 8,837,214.

(51) Int. Cl.

| | |
|---|---|
| G11C 16/04 | (2006.01) |
| G11C 27/00 | (2006.01) |
| G11C 7/00 | (2006.01) |
| G11C 13/00 | (2006.01) |
| G11C 16/10 | (2006.01) |
| G11C 16/26 | (2006.01) |
| G11C 16/32 | (2006.01) |

(52) U.S. Cl.
CPC ......... *G11C 27/00* (2013.01); *G11C 7/00* (2013.01); *G11C 13/0002* (2013.01); *G11C 13/004* (2013.01); *G11C 13/0061* (2013.01); *G11C 13/0069* (2013.01); *G11C 16/10* (2013.01); *G11C 16/26* (2013.01); *G11C 16/32* (2013.01); *G11C 27/005* (2013.01)

(58) Field of Classification Search
USPC ........................... 365/185.03, 185.11, 185.18
See application file for complete search history.

(56) References Cited

U.S. PATENT DOCUMENTS

| | | | |
|---|---|---|---|
| 6,353,554 B1 * | 3/2002 | Banks | ........................ 365/185.03 |
| 7,136,304 B2 | 11/2006 | Cohen et al. | |
| 7,304,896 B2 | 12/2007 | Martines et al. | |
| 8,274,838 B2 | 9/2012 | Dutta et al. | |
| 8,400,841 B2 | 3/2013 | Maayan | |

* cited by examiner

Primary Examiner — Vu Le
(74) Attorney, Agent, or Firm — Meyertons, Hood, Kivlin, Kowert & Goetzel, P.C.

(57) ABSTRACT

A method includes, in an array of analog memory cells that are arranged in rows associated with respective word lines, reading a first group of the memory cells in a selected word line, including one or more memory cells that store a status of at least one word line in the array other than the selected word line. A readout configuration for a second group of the memory cells is set responsively to the read status. The second group of the memory cells is read using the readout configuration.

20 Claims, 5 Drawing Sheets

| Regular Cells (bitlines) | Block Status Cells (bitlines) | | | | | | | |
|---|---|---|---|---|---|---|---|---|
| e.g. 8/16kB cells | 0 | 1 | 2 | 3 | 4 | 5 | 6 | 7 |

WORD-LINES 0-7

FIG. 9A

| Regular Cells (bitlines) | Block Status Cells (bitlines) | | | | | | | |
|---|---|---|---|---|---|---|---|---|
| e.g. 8/16kB cells | 0 | 1 | 2 | 3 | 4 | 5 | 6 | 7 |

WORD-LINES 0-7

APPLICATIONS FOR INTER-WORD-LINE PROGRAMMING

CROSS-REFERENCE TO RELATED APPLICATIONS

This application a continuation of U.S. patent application Ser. No. 13/709,303, filed Dec. 10, 2012, which is related to a U.S. patent application Ser. No. 13/709,267 entitled "Inter-word-line programming in arrays of analog memory cells," filed on even date, which is assigned to the assignee of the present patent application and whose disclosure is incorporated herein by reference.

TECHNICAL FIELD

Embodiments described herein are related to the field of memory devices, and particularly to methods and systems for data storage in arrays of analog memory cells.

BACKGROUND

Several types of memory devices, such as Flash memories, use arrays of analog memory cells for storing data. Each analog memory cell stores a quantity of an analog value, also referred to as a storage value, such as an electrical charge or voltage. The storage value represents the information stored in the cell. In Flash memories, for example, each analog memory cell holds a certain amount of electrical charge. The range of possible analog values is typically divided into regions, each region corresponding to one or more data bit values. Data is written to an analog memory cell by writing a nominal analog value that corresponds to the desired bit or bits.

Flash memory devices are described, for example, by Bez et al., in "Introduction to Flash Memory," Proceedings of the IEEE, volume 91, number 4, April, 2003, pages 489-502, which is incorporated herein by reference. Multi-level Flash cells and devices are described, for example, by Eitan et al., in "Multilevel Flash Cells and their Trade-Offs," Proceedings of the 1996 IEEE International Electron Devices Meeting (IEDM), New York, N.Y., pages 169-172, which is incorporated herein by reference. The paper compares several kinds of multilevel Flash cells, such as common ground, DINOR, AND, NOR and NAND cells.

Eitan et al., describe another type of analog memory cell called Nitride Read Only Memory (NROM) in "Can NROM, a 2-bit, Trapping Storage NVM Cell, Give a Real Challenge to Floating Gate Cells?" Proceedings of the 1999 International Conference on Solid State Devices and Materials (SSDM), Tokyo, Japan, Sep. 21-24, 1999, pages 522-524, which is incorporated herein by reference. NROM cells are also described by Maayan et al., in "A 512 Mb NROM Flash Data Storage Memory with 8 MB/s Data Rate," Proceedings of the 2002 IEEE International Solid-State Circuits Conference (ISSCC 2002), San Francisco, Calif., Feb. 3-7, 2002, pages 100-101, which is incorporated herein by reference. Other exemplary types of analog memory cells are Floating Gate (FG) cells, Ferroelectric RAM (FRAM) cells, magnetic RAM (MRAM) cells, Charge Trap Flash (CTF) and phase change RAM (PRAM, also referred to as Phase Change Memory—PCM) cells. FRAM, MRAM and PRAM cells are described, for example, by Kim and Koh in "Future Memory Technology including Emerging New Memories," Proceedings of the 24$^{th}$ International Conference on Microelectronics (MIEL), Nis, Serbia and Montenegro, May 16-19, 2004, volume 1, pages 377-384, which is incorporated herein by reference.

SUMMARY

An embodiment that is described herein provides a method, which includes selecting a word line for programming in an array of analog memory cells that are arranged in rows associated with respective word lines and columns associated with respective bit lines. Word-line voltages, which program the memory cells in the selected word line, are applied to the respective word lines. Bit-line voltages, which cause one or more additional memory cells outside the selected word line to be programmed as a result of programming the selected word line, are applied to the respective bit lines. Using the applied word-line and bit-line voltages, data is stored in the memory cells in the selected word line and the additional memory cells are simultaneously programmed.

In some embodiments, programming the additional memory cells includes programming the memory cells in one or more bit lines that are assigned to indicate a programming status of the selected word line. In other embodiments, applying the bit-line voltages includes applying to a bit line that contains the additional memory cells an enabling voltage, which is lower than the enabling voltage applied to the bit lines used for storing the data in the selected word line.

In an embodiment, applying the word-line and bit-line voltages includes over-programming a memory cell that is associated with the selected word line and with a bit line that contains the additional memory cells. In another embodiment, the additional memory cells have a first responsiveness to programming, and a memory cell, which is associated with the selected word line and with a bit line that contains the additional memory cells, has a second responsiveness to programming that is poorer than the first responsiveness. In yet another embodiment, the memory cells in the selected word line have a first responsiveness to programming, and the additional memory cells have a second responsiveness to programming that is better than the first responsiveness.

In still another embodiment, a bit line that contains the additional memory cells has no memory cell that is associated with the selected word line. In an embodiment, applying the bit-line voltages includes applying an enabling voltage to a bit line containing the additional memory cells, and applying the word-line voltages includes applying a programming voltage to the word lines containing the additional memory cells. In an embodiment, programming the additional memory cells includes, after programming a given word line, programming a single additional memory cell in a previous word line to indicate that the given word line is programmed.

There is additionally provided, in accordance with an embodiment, apparatus including an array of analog memory cells, and storage circuitry. The analog memory cells are arranged in rows associated with respective word lines and columns associated with respective bit lines. The storage circuitry is configured to select a word line for programming, to apply to the word lines respective word-line voltages that program the memory cells in the selected word line, to apply to the bit lines respective bit-line voltages that cause one or more additional memory cells outside the selected word line to be programmed as a result of programming the selected word line, and, using the applied word-line and bit-line voltages, to store data in the memory cells in the selected word line and simultaneously program the additional memory cells.

There is further provided, in accordance with an embodiment, a method. The method includes, in an array of analog memory cells that are arranged in rows associated with respective word lines, reading a first group of the memory cells in a selected word line, including one or more memory cells that store a status of at least one word line in the array other than the selected word line. A readout configuration for a second group of the memory cells is set responsively to the read status. The second group of the memory cells is read using the readout configuration.

In some embodiments, the first group equals the second group. In other embodiments, the first group differs from the second group. In a disclosed embodiment, setting the readout configuration includes setting one or more read thresholds for reading the second group of the memory cells. In another embodiment, setting the readout configuration includes estimating, based on the read status, an interference inflicted on the second group of the memory cells by the at least one word line other than the selected word line, and defining the readout configuration so as to cancel the estimated interference. In an embodiment, the method includes deciding, based on the read status, whether to read the at least one word line in order to cancel the interference.

In yet another embodiment, setting the readout configuration includes estimating, based on the read status, a Back-Pattern Dependency (BPD) caused to the second group of the memory cells, and defining the readout configuration so as to cancel the estimated BPD. In still another embodiment, setting the readout configuration includes defining the readout configuration based on the status of a word line that neighbors the selected word line.

In an embodiment, the analog memory cells in the array are arranged in columns associated with respective bit lines, and each word line is assigned a respective group of one or more bit lines that include the memory cells that store the status of that word line. The array may include at least one physical boundary that is inserted between one of the bit lines that store the status and another bit line. Setting the readout configuration may include identifying, based on the read status, a word line in the array that was programmed most recently.

There is additionally provided, in accordance with an embodiment, apparatus including an array of analog memory cells, and storage circuitry. The analog memory cells are arranged in rows associated with respective word lines. The storage circuitry is configured to read a first group of the memory cells in a selected word line, including one or more memory cells that store a status of at least one word line in the array other than the selected word line, to set a readout configuration for a second group of the memory cells responsively to the read status, and to read the second group of the memory cells using the readout configuration.

The described embodiments will be more fully understood from the following detailed description of the embodiments thereof, taken together with the drawings in which:

DETAILED DESCRIPTION OF EMBODIMENTS

Overview

A memory block in a non-volatile memory device typically comprises an array of analog memory cells that are arranged in rows and columns. The rows are associated with respective word lines, and the columns are associated with respective bit lines. The memory cells are programmed with data by applying suitable voltages to the word lines and bit lines.

In most practical memory devices, memory cells in different word lines of the memory block affect one another. In particular, the optimal readout configuration for the memory cells in a given word line often depends on the programming status of one or more other word lines in the block. For example, the optimal read thresholds for use in a given word line may depend on whether (and to what extent) the memory cells in other (e.g., neighboring) word lines are programmed.

When preparing to read a given word line, it is possible in principle to find out the programming status of other word lines by reading them. This solution, however, involves a large number of unnecessary readout operations, and therefore incurs unnecessary latency and power consumption.

Embodiments that are described herein provide improved methods and systems for programming and reading arrays of analog memory cells. In some embodiments, the memory cells are programmed and read by storage circuitry, e.g., circuitry in the memory device and/or a memory controller or host. The storage circuitry assigns in each word line one or more status memory cells, which store the programming status of one or more other word lines in the block. By reading the status memory cells of a given word line, the storage circuitry is able to identify the status of the other word lines without unnecessary additional readout operations.

Several techniques for programming the status memory cells are described herein. These techniques typically apply suitable voltages to the various bit lines and word lines of the block, which program a selected word line and simultaneously program the status memory cells of other word lines. Other disclosed techniques use the status memory cells for efficient, high-performance readout, e.g., for deciding whether or not to apply interference cancellation or for mitigating Back-Pattern Dependency (BPD) effects.

Since the disclosed techniques reduce the number of readout operations, they improve the readout throughput and latency of the memory device and reduce its power consumption.

System Description

Figure 1:
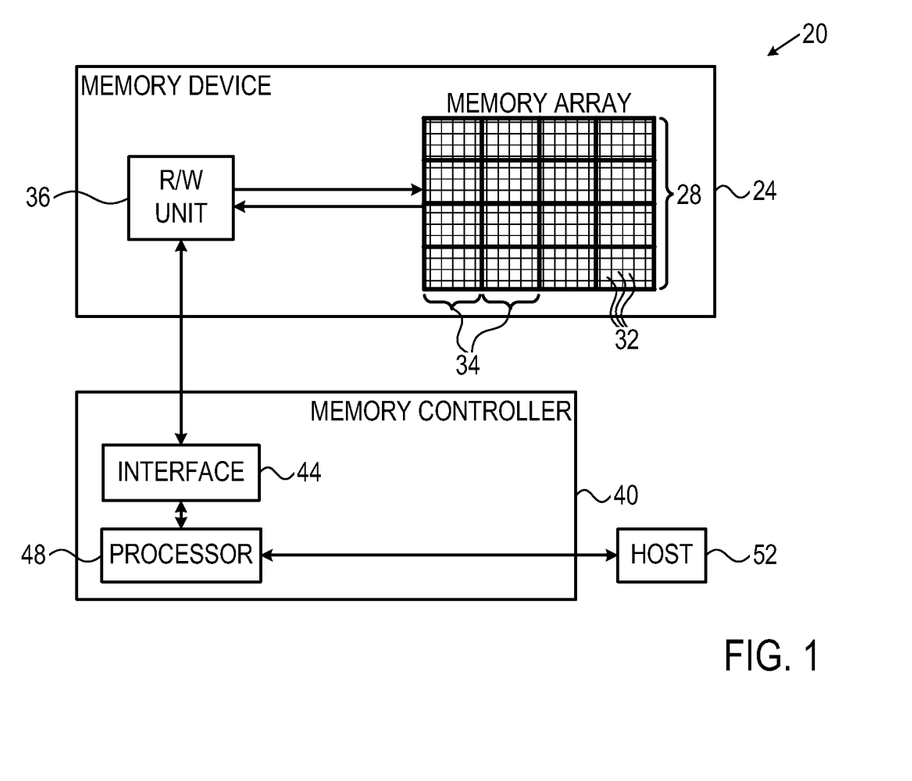
FIG. 1 is a block diagram that schematically illustrates a memory system, in accordance with an embodiment.

FIG. 1 is a block diagram that schematically illustrates a memory system 20, in accordance with an embodiment. System 20 can be used in various host systems and devices, such as in computing devices, cellular phones or other communication terminals, removable memory modules (sometimes referred to as "USB Flash Drives"), Solid State Disks (SSD), digital cameras, music and other media players and/or any other system or device in which data is stored and retrieved.

System 20 comprises a memory device 24, which stores data in a memory cell array 28. The memory array comprises multiple memory blocks 34. Each memory block 34 comprises multiple analog memory cells 32. In the context of the present patent application and in the claims, the term "analog memory cell" is used to describe any memory cell that holds a continuous, analog value of a physical parameter, such as an electrical voltage or charge. Array 28 may comprise analog memory cells of any kind, such as, for example, NAND, NOR and Charge Trap Flash (CTF) Flash cells, phase change RAM (PRAM, also referred to as Phase Change Memory—PCM), Nitride Read Only Memory (NROM), Ferroelectric RAM (FRAM), magnetic RAM (MRAM) and/or Dynamic RAM (DRAM) cells. Although the embodiments described herein refer mainly to two-dimensional (2D) cell connectivity schemes, the disclosed techniques are applicable to three-dimensional (3D) connectivity schemes, as well.

The charge levels stored in the cells and/or the analog voltages or currents written into and read out of the cells are referred to herein collectively as analog values, analog storage values or storage values. The storage values may comprise, for example, threshold voltages or any other suitable kind of storage values. System 20 stores data in the analog memory cells by programming the cells to assume respective programming states, which are also referred to as programming levels. The programming states are selected from a finite set of possible states, and each programming state corresponds to a certain nominal storage value. For example, a 3 bit/cell MLC can be programmed to assume one of eight possible programming states by writing one of eight possible nominal storage values into the cell.

Memory device 24 comprises a reading/writing (R/W) unit 36, which converts data for storage in the memory device to analog storage values and writes them into memory cells 32. In alternative embodiments, the R/W unit does not perform the conversion, but is provided with voltage samples, i.e., with the storage values for storage in the cells. When reading data out of array 28, R/W unit 36 converts the storage values of memory cells into digital samples having a resolution of one or more bits. Data is typically written to and read from the memory cells in groups that are referred to as pages. In some embodiments, the R/W unit can erase a group of cells 32 by applying one or more negative erasure pulses to the cells. Erasure is typically performed in entire memory blocks.

The storage and retrieval of data in and out of memory device 24 is performed by a memory controller 40. The memory controller comprises an interface 44 for communicating with memory device 24, and a processor 48 that carries out the various memory management functions. Memory controller 40 communicates with a host 52, for accepting data for storage in the memory device and for outputting data retrieved from the memory device. Memory controller 40, and in particular processor 48, may be implemented in hardware. Alternatively, the memory controller may comprise a microprocessor that runs suitable software, or a combination of hardware and software elements.

The configuration of FIG. 1 is an exemplary system configuration, which is shown purely for the sake of conceptual clarity. Any other suitable memory system configuration can also be used. Elements that are not necessary for understanding the principles of the present invention, such as various interfaces, addressing circuits, timing and sequencing circuits and debugging circuits, have been omitted from the figure for clarity.

Although the example of FIG. 1 shows a single memory device 24, system 20 may comprise multiple memory devices that are controlled by memory controller 40. In the exemplary system configuration shown in FIG. 1, memory device 24 and memory controller 40 are implemented as two separate Integrated Circuits (ICs). In alternative embodiments, however, the memory device and the memory controller may be integrated on separate semiconductor dies in a single Multi-Chip Package (MCP) or System on Chip (SoC), and may be interconnected by an internal bus. Further alternatively, some or all of the memory controller circuitry may reside on the same die on which the memory array is disposed. Further alternatively, some or all of the functionality of memory controller 40 can be implemented in software and carried out by a processor or other element of the host system. In some embodiments, host 44 and memory controller 40 may be fabricated on the same die, or on separate dies in the same device package.

In some embodiments, memory controller 40 comprises a general-purpose processor, which is programmed in software to carry out the functions described herein. The software may be downloaded to the processor in electronic form, over a network, for example, or it may, alternatively or additionally, be provided and/or stored on non-transitory tangible media, such as magnetic, optical, or electronic memory.

In an example configuration of array 28, memory cells 32 are arranged in multiple rows and columns, and each memory cell comprises a floating-gate transistor. The gates of the transistors in each row are connected by word lines, and the sources of the transistors in each column are connected by bit lines. The memory array is typically divided into multiple pages, i.e., groups of memory cells that are programmed and read simultaneously. Pages are sometimes sub-divided into sectors. In some embodiments, each page comprises an entire row of the array. In alternative embodiments, each row (word line) can be divided into two or more pages. For example, in some devices each row is divided into two pages, one comprising the odd-order cells and the other comprising the even-order cells.

Typically, memory controller 40 programs data in page units, but erases entire memory blocks 34. Typically although not necessarily, a memory block is on the order of $10^6$ memory cells, whereas a page is on the order of $10^3$-$10^4$ memory cells.

The description that follows describes several example techniques for assessing the health levels or wear levels of memory cells 32 or groups of memory cells 32. The disclosed techniques can be carried out by memory controller 40 and/or by R/W unit 36. For the sake of clarity, the description that follows refers to a particular division of functions between R/W unit 36 in the memory device and processor 48 in memory controller 40. Generally, however, the various tasks making-up the disclosed techniques can be divided between the memory controller and the R/W unit in any suitable manner, or performed by any one of these elements. Thus, in the context of the present patent application and in the claims, memory controller 40 and R/W circuitry 36 are referred to jointly as storage circuitry that carries out the disclosed techniques.

Figure 2:
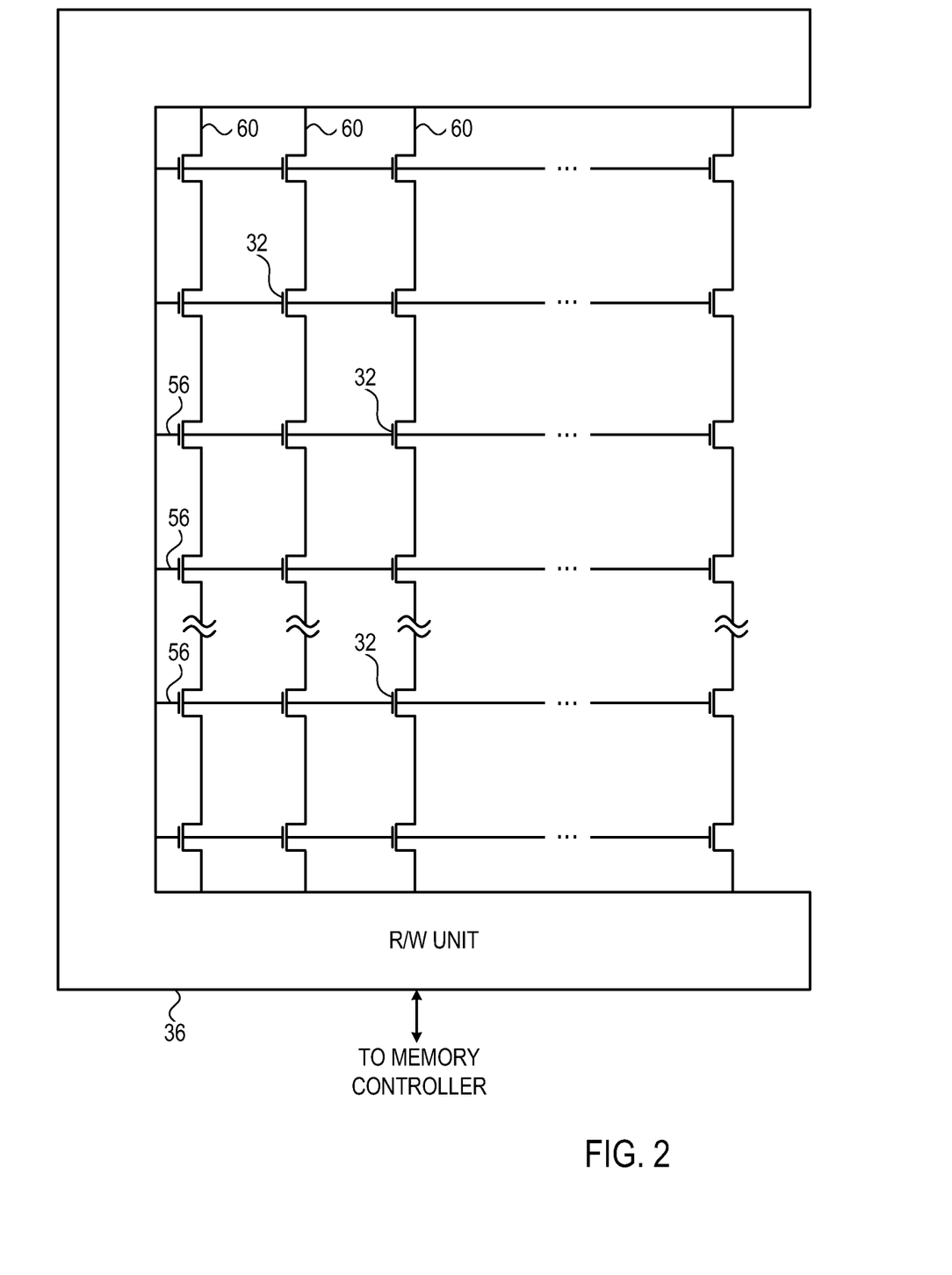
FIG. 2 is a block diagram that schematically illustrates a Read/Write (R/W) unit, in accordance with an embodiment.

FIG. 2 is a block diagram that schematically illustrates R/W unit 36, in accordance with an embodiment of the present invention. As explained above, memory cells 32 are arranged in multiple rows and columns, and each memory cell comprises a floating-gate transistor. The gates of the cells in each row are connected by a respective word line 56, and the sources of the cells in each column are connected by a respective bit line 60. The memory cells (transistors) along each bit line 60 are connected source-to-drain in series with one another.

In alternative embodiments, the memory cells of a given word line are divided into groups that are referred to as strings. The memory cells in each string are connected source-to-drain in series with one another, between the bit line and ground. Each string can typically be connected and disconnected individually to the bit line.

In a typical embodiment, R/W unit 36 converts data for storage into analog storage values, applies the appropriate voltages to the bit lines and word lines of the memory, and writes the analog values into memory cells 32. When reading data out of memory cells 32, R/W unit 36 typically converts the analog values of the memory cells into digital samples. R/W unit 36 is typically connected to memory controller 40 or other external system over a suitable interface.

It should be noted that the connectivity scheme of FIG. 2 is an example connectivity scheme, and that any other suitable connectivity scheme can be used in alternative embodiments, for example 3D schemes.

Inter-Word-Line Programming Schemes

Analog memory cells are typically programmed by applying suitable voltages to the various word lines and bit lines. Consider, for example, an array of NAND Flash cells. In a conventional programming scheme, a target memory cell is programmed by (i) applying a programming voltage denoted Vpgm to the word line of the target cell, (ii) applying a pass voltage denoted Vpass to the other word lines, (iii) applying an enabling voltage denoted Ven to the bit line of the target cell, and (iv) applying a disable voltage denoted Vds to the other bit lines. Typically, Vpass<<Vpgm and Vds>>Ven. Under these conditions, electrical charge will typically be added only to the target cell. Some small residual charge may still be unintentionally be added to other cells.

Embodiments of the present invention that are described below provide techniques for programming the memory cells in a given word line, while at the same time programming one or more memory cells in an additional, designated bit line. These techniques can be used, for example, for programming the status cells in one word line to reflect the programming status of another word line. Such techniques are referred to herein as inter-word-line programming.

In other words, consider a word line X, in which a status cell is assigned to store the binary programming status ("programmed" or "erased") of a word line Y. While storing data in word line Y, the disclosed techniques can be used for simultaneously programming the status cell of word line X with the programming status of word line Y. When word line X will eventually be read, including the status cell, it will be possible to identify the programming status of word line Y from the status cell without having to perform additional read operations.

Figure 3:
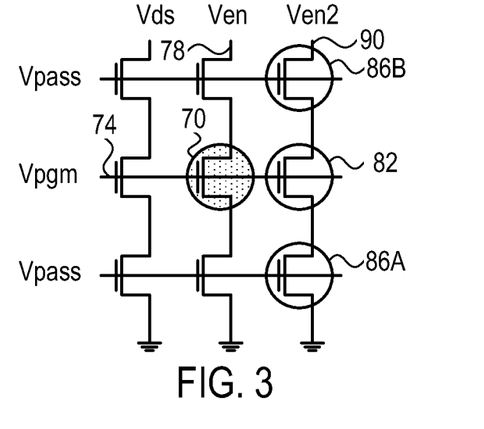
FIGS. 3-8 are diagrams that schematically illustrate word-line and bit-line voltage schemes for inter-word-line programming, in accordance with various embodiments.

FIG. 3 is a diagram that schematically illustrates a word-line and bit-line voltage scheme for inter-word-line programming, in accordance with an embodiment of the present invention. The example of FIG. 3 (as well as the examples of FIGS. 4-8 below) shows a group of nine memory cells from array 28 for the sake of clarity. The disclosed technique is typically applied in a similar manner across the entire array.

In the present example, a cell 70, which belongs to a word line 74 and a bit line 78, is to be programmed. In order to program this cell, R/W unit 36 applies Vpgm to word line 74 and Vpass to the other word lines. The R/W unit applies Ven to bit line 78, and applies Vds to the other bit lines with one exception: The R/W unit applies a second enabling voltage denoted Ven2 to a bit line 90.

Typically the second enabling voltage is set so that Ven2<<Ven. Under these conditions, memory cells 86A and 86B in bit line 90 (which are outside word line 74) will be programmed. Other memory cells in bit line 90 outside word line 74, not shown in the figure, will also be programmed. In addition, a memory cell 82 (in the intersection of word line 74 and bit line 90) will also typically be programmed.

In some embodiments, Ven=0V. In these embodiments, the condition Ven2<<Ven implies the use of negative voltages. Alternatively, Ven2 can be set to zero, and the other bit line and word line voltages increased accordingly.

As can be seen in the figure, the example scheme of FIG. 3 (as well as the examples of FIGS. 4-8 below) programs the selected word line 74 and simultaneously programs one or more additional cells outside the selected word line. In some embodiments, these additional cells comprise status cells that indicate the programming status of word line 74.

In some embodiments, the entire bit line 90 is designated for indicating the programming status of word line 74. In these embodiments, in each word line other than word line 74, the memory cell in bit line 90 serves as a status cell that indicates the programming status of word line 74.

Typically, memory cell 82 in FIG. 3 will be programmed intensively, and possibly over-programmed. This effect may be undesirable, and techniques for mitigating it will be described further below. In some embodiments, however, the R/W unit can make use of the intensive programming of cell 82. If cell 82 is over-programmed, then bit line 90 will not conduct for any word line that is being read, regardless of the threshold voltage of the other cells in bit line 90. This readout result can also be used as a programming status indication.

In some embodiments, R/W unit 36 intentionally over-programs cell 82, e.g., by setting a high programming-verification threshold for this cell, or by appropriate setting of the bit-line and word-line voltages.

Figure 4:
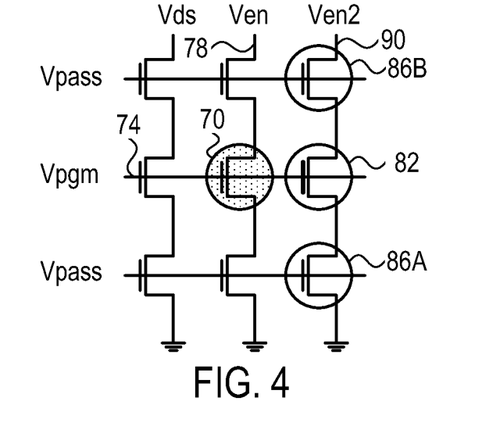

FIG. 4 is a diagram that schematically illustrates a word-line and bit-line voltage scheme for inter-word-line programming, in accordance with another embodiment of the present invention. In this embodiment, memory cell 82 has different physical characteristics than the other memory cells in bit line 90. Memory cell 82 is typically designed to be less responsive to programming voltages, i.e., to have a poorer programming efficiency, so as to prevent or reduce the likelihood of intensive programming or over-programming.

In an example embodiment, cell 82 may comprise a thicker Silicon-dioxide (SiO2) layer between its Silicon substrate and the floating gate, in comparison with the other memory cells in the same bit line. The thicker SiO2 layer helps to decrease the electrical field that programs the cell. In another embodiment, cell 82 may comprise a thicker Oxide-Nitride-Oxide (ONO) Inter-Poly Dielectric (IPD) layer in comparison with the other memory cells in bit line 90. The thicker ONO IPD layer decreases the coupling between the control gate and the floating gate. Alternatively, cell 82 may differ from the other memory cells in its bit line in any other suitable way that helps to reduce intensive programming.

Figure 5:
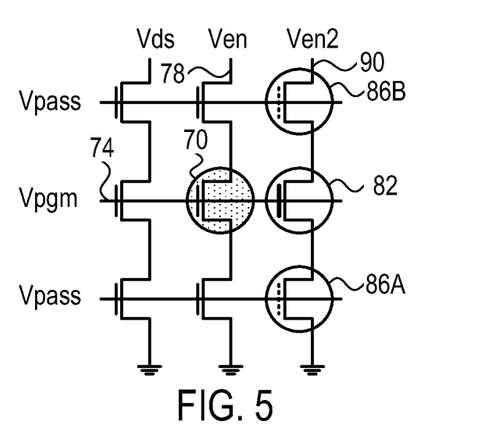

FIG. 5 is a diagram that schematically illustrates a word-line and bit-line voltage scheme for inter-word-line programming, in accordance with yet another embodiment of the present invention. In this embodiment, memory cells 86A and 86B (the memory cells outside the selected word line that are programmed simultaneously with the selected word line) have physical characteristics that differ from the other cells used for storing data in the selected word line. In the present example, cells 86A and 86B have characteristics that make them more responsive to programming, i.e., to have better programming efficiency. The higher responsiveness enables unit 36, for example, to use Ven2=Ven and still achieve sufficient programming of cells 86A and 86B.

Improved programming efficiency in cells 86A and 86B can be achieved, for example, by using a thinner SiO2 layer between the substrate and floating gate, or using any other suitable means. In the embodiment of FIG. 5, Ven2 can be optimized to match the characteristics of the cells of bit line 90. Cell 82 in this embodiment may have characteristics that are the same as the other cells (e.g., as in FIG. 3), or having poorer programming efficiency relative to the other cells (e.g., as in FIG. 4).

Figure 6:
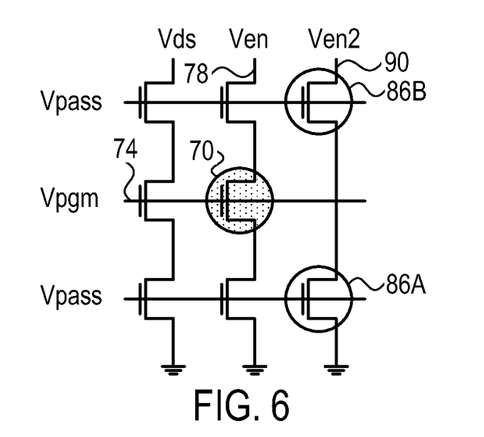

FIG. 6 is a diagram that schematically illustrates a word-line and bit-line voltage scheme for inter-word-line programming, in accordance with an alternative embodiment of the present invention. In this embodiment, memory cell is omitted, in order to prevent the above-described over-programming effect. In other words, no memory cell is placed in the intersection of word line 74 (the selected word line) and bit line 90 (the bit line containing the status cells that indicate the status of the selected word line).

The scheme of FIG. 6 may be combined with the schemes described above, e.g., the scheme of FIG. 5, or the scheme in which Ven2=Ven. In yet another embodiment, the cell at the intersection of word line 74 and bit line may comprise a regular, non-floating-gate Complementary Metal Oxide Semiconductor (CMOS) transistor instead of a floating-gate transistor.

Figure 7:
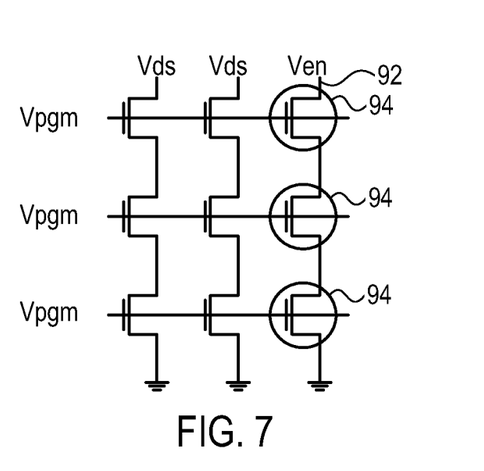

FIG. 7 is a diagram that schematically illustrates a word-line and bit-line voltage scheme for inter-word-line programming, in accordance with an embodiment of the present invention. In this embodiment, R/W unit 36 programs a desired bit line 92 (e.g., a bit line of status cells) by applying Vpgm to the various word lines, applying Ven to bit line 92, and applying Vds to the other bit lines.

Figure 8:
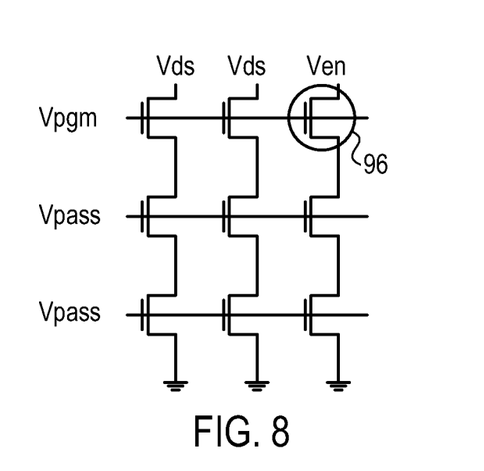

FIG. 8 is a diagram that schematically illustrates a word-line and bit-line voltage scheme for inter-word-line programming, in accordance with another embodiment of the present invention. In this scheme, a single bit line is assigned to serve as status cells. In each word line, the single status cell indicates whether the next word line is programmed or not. In the example of FIG. 8, after the $i^{th}$ word line is programmed, a status cell 96 in the $(i-1)^{th}$ word line is programmed. The cell is programmed by applying Vpgm and Ven to the word line and bit line of this cell, respectively.

The voltage schemes shown in FIGS. 3-8 are example schemes, which are chosen purely for the sake of conceptual clarity. In alternative embodiments, any other suitable scheme can be used.

Example Memory Block Configurations Using Inter-Word-Line Programming

Figure 9A:
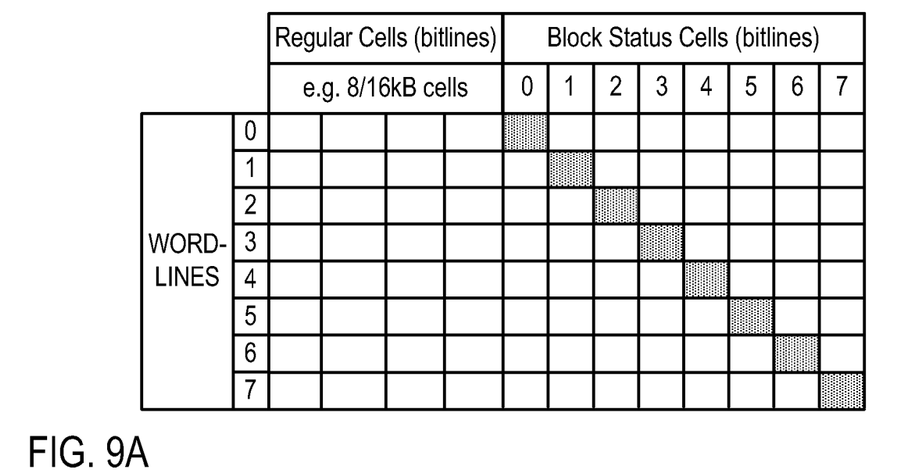
FIGS. 9A and 9B are diagrams that schematically illustrate a memory block that is programmed using inter-word-line programming, in accordance with an embodiment.
Figure 9B:
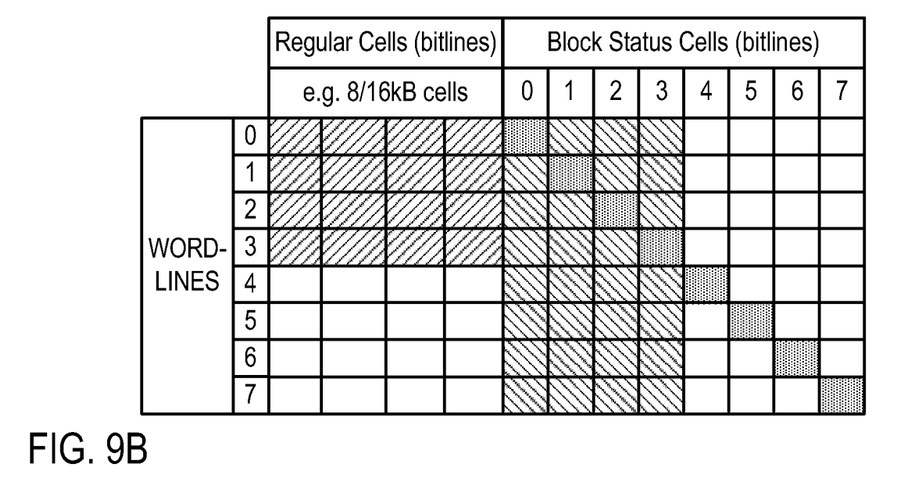

FIGS. 9A and 9B are diagrams that schematically illustrate a memory block that is programmed using inter-word-line programming, in accordance with an embodiment of the present invention. In this embodiment, the memory block comprises a respective status bit line for every word line—The $i^{th}$ status bit line indicates the programming status of the $i^{th}$ word line. In other words, when reading any word line, the $i^{th}$ status cell in the word line indicates the programming status of the $i^{th}$ word line. The example of FIGS. 9A and 9B shows a block of eight word lines for the sake of clarity.

Real-life memory blocks typically comprise a considerably larger number of word lines. Nevertheless, the number of bit lines per block is typically much larger than the number of word lines (e.g., 8000 or 16000 bit lines and several hundreds of word lines). Therefore, assigning a respective status bit line for every word line in the block is feasible.

In the present example, when R/W unit 36 programs the $i^{th}$ word line, it simultaneously programs the $i^{th}$ status bit line, for example using one of the schemes of FIGS. 3-8 above. Thus, a given status bit line may have all of its cells erased (if the corresponding word line is not programmed) or programmed to some positive threshold voltage (if the corresponding word line is programmed). When reading a given word line, the status memory cells provide complete information as to the programming status of the other word lines.

In some embodiments, the $i^{th}$ status cell of the $i^{th}$ word line (the cells shaded in FIG. 9A) do not convey new information, because they indicate whether the word line being currently read is programmed or not. In another embodiment, these cells can replace conventional word-line status cells, i.e., indicate to the R/W unit whether the current word line is programmed.

FIG. 9B shows an example in which the first four word lines (word lines 0-3, shaded in the figure) are programmed with data, whereas the other word lines (word lines 4-7) are not programmed (i.e., erased). Accordingly, status bit lines 0-3 (shaded in the figure) have all their memory cells programmed, and status bit lines 4-7 have all their memory cells erased. Thus, when reading any word line, status cells 0-3 of the read word line will be programmed and status cells 4-7 will be erased. Using this technique, the status cells of any word line indicate the programming status of all other word lines.

The block configuration shown in FIGS. 9A and 9B is an example configuration that is chosen for the sake of conceptual clarity. In alternative embodiments, any other suitable block configuration can be used.

For example, in FIGS. 9A and 9B a single status bit line is assigned for every respective word line. In other words, each word line comprises a single respective status cell per word line. In alternative embodiments, two or more respective status bit lines may be assigned to indicate the programming status of each word line. This feature enables higher resolution in representing the word-line programming status. For example, in some embodiments each word line is capable of storing multiple pages, e.g., a Least Significant Bit (LSB) page and a Most Significant Bit (MSB) page.

In these embodiments, two status bit lines may be assigned for each word lines, so as to indicate whether the word line is erase, programmed with only the LSB page or programmed with both the LSB and MSB pages. Alternatively, each multi-bit word line may be assigned a single status bit line that indicates whether or not the word line is fully programmed (i.e., with all bits).

As another example, multiple status bit lines may be assigned to each word line, in order to increase the reliability of the status information using some code. For example, three status bit lines may be used to store a binary indication of whether the corresponding word line is programmed or erased. When reading a given word line, R/W unit 36 may calculate a majority vote among the values of the multiple status cells. When using another type of code, the R/W unit would read the encoded status information from the status cells and decode it to obtain the programming status information.

In some embodiments, the programming of the status cells may have a higher error probability than the stored data. This error probability can be handled in various ways, for example using the redundancy schemes described above or using any other suitable error correction scheme.

In some embodiments, the assignment of status bit lines is fixed and hard-wired in the design of the memory block. The assignment is fixed, for example, when the physical structure of the status bit lines differs from that of the other bit lines (e.g., in the schemes of FIGS. 4, 5 and 6). In other embodiments (such as when using the scheme of FIGS. 3, 7 and 8), the assignment of status bit lines may not be fixed, and any bit line may be chosen to serve as a status bit line.

In some embodiments, when the status bit lines are assigned in a particular region of the block, one or more dummy bit lines or other physical boundary may be inserted between the status bit lines and the other bit lines of the block. This physical boundary helps to protect the bit lines that store data from interference that may be caused by the programming of the status bit lines. Physical boundaries may also be inserted between status bit lines, or between groups of status bit lines (when a group of status bit lines is assigned to each word line).

In some embodiments, the memory cells in each word line are divided into odd-order and even-order cells. Typically, one data page is stored in the odd-order cells and another page is stored in the even-order cells. In these embodiments, the number of status bit lines may be doubled in order to provide separate programming status indication for the odd-order and even-order cells. In an embodiment, although not necessarily, the status bit lines for the odd-order and even-order cells may also be interleaved in an odd-even manner.

In some embodiments, as explained above, the memory cells of each bit lines are divided among multiple strings that can be connected to or disconnected from the bit line. In these embodiments, any of the techniques described herein can be used, with strings playing the role of bit lines.

Applications of Inter-Word-Line Programming

In various embodiments, memory controller 40 may use the word line status information provided by the status cells in different ways and for different purposes. Generally speaking, the memory controller reads a given word line, uses the status information in the status cells to determine the programming status of one or more other word lines, and uses this information to define the readout configuration for a subsequent readout operation. The subsequent readout operation may be performed on the same word line or on a different word line.

In an example embodiment, memory controller 40 extracts the word-line status information from the status cells in a given word line, and uses this information to estimate the interference inflicted on the given word line by one or more other word lines. The potentially interfering word lines may comprise an adjacent word line (e.g., the next word line in the block) or any desired number of word lines, typically neighbors of the given word lines. When using this technique, the memory controller is able to estimate the interference without actually reading the interfering word lines, and thus reduce latency and power consumption.

Once the interference to the given word line is estimated, the memory controller may define the readout configuration for re-reading the word line so as to cancel the interference. For example, the memory controller may adjust the read thresholds used for reading the given word line based on the estimated interference.

In an example flow, the memory controller reads the given word line and determines (using the status cells) whether the next word line is programmed or not. If the next word line is programmed, the memory controller reads the next word line and cancels the interference. If the next word line is not programmed, the memory controller refrains from reading the next word line, and thus reduces latency and power consumption.

In alternative embodiments, the memory controller uses the status information to mitigate Back-Pattern Dependency (BPD) effects. BPD is caused by the difference between the bit-line (or string) resistance during programming and during readout. BPD causes a threshold voltage shift in memory cells whose bit-line resistance has changed between programming time and readout time. The bit line resistance may change, for example, when the given word line is programmed while most of the other word lines are still erased, and then read after additional word lines have been written. Thus, the programming status of the various word lines is indicative of the presence or intensity of the BPD effect in a given word line.

Thus, in some embodiments the memory controller reads a given word line, and uses the status information in the read word line to estimate the BPD. The memory controller then sets the readout configuration (e.g., adjusts the read thresholds) in order to cancel the BPD-related distortion. A technique of this sort is effective not only against BPD, but against any other kind of distortion or impairment that depends on the programming status of one or more other word lines.

As yet another example, the memory controller may use the status information in one word line to define the readout configuration for reading another word line. Consider, for example, a scenario in which the memory controller reads the word lines in the block one after the other in a sequential manner. When reading the $i^{th}$ word line, the memory controller may use the status information obtained from the $i^{th}$ word line to estimate the interference inflicted by any of the word lines on the $(i+1)^{th}$ word line. Using this estimate, the memory controller may set the read thresholds for the $(i+1)^{th}$ word line so as to best cancel the interference. Thus, the first readout operation from the $(i+1)^{th}$ word line will already use the optimal read thresholds.

As another example, the memory controller may use the status information for identifying the most recently programmed word line in the block, e.g., in order to determine the next word line to be programmed. In an example scenario, the memory controller wakes-up from power interruption and needs to identify the most recently programmed word line in the block in order to continue programming. The memory controller may read a single word line from the block, and use the status information in this word line to identify the word line that was last programmed. The memory controller may carry out this process by reading two or more word lines, in order to increase the reliability of the identification.

Further alternatively, memory controller 40 (or the storage circuitry in general) may use the status information in any other suitable way and for any other suitable purpose.

Figure 10:
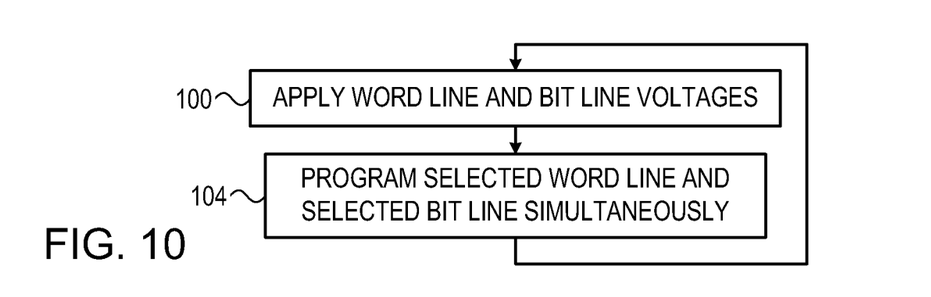
FIG. 10 is a flow chart that schematically illustrates a method for inter-word-line programming, in accordance with an embodiment.

FIG. 10 is a flow chart that schematically illustrates a method for simultaneously programming a selected word line and a corresponding status bit line, in accordance with an embodiment of the present invention. The method begins with R/W unit 36 applying appropriate word line and bit line voltages, at a biasing step 100. Any of the schemes of FIGS. 3-8 above can be used for this purpose. The R/W unit then programs the selected word line and the corresponding status bit line while the bit line and word line voltages are applied, at a programming step 104.

Figure 11:
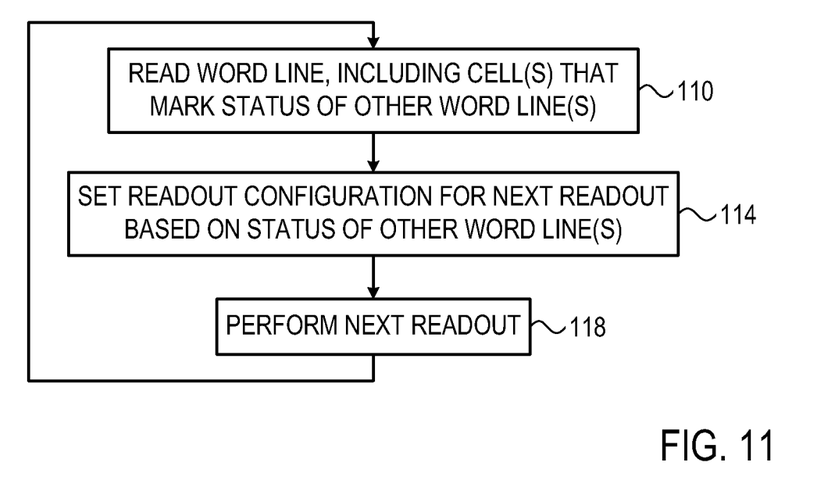
FIG. 11 is a flow chart that schematically illustrates a method for reading a memory block that was programmed using inter-word-line programming, in accordance with an embodiment.

FIG. 11 is a flow chart that schematically illustrates a method for reading a memory block that was programmed using inter-word-line programming, in accordance with an embodiment of the present invention. The method begins with memory controller 40 reading a selected word line, including the designated status cells that indicate the programming status of other word lines, at a readout step 110.

Based on the programming status of other word lines, the memory controller defines a readout configuration (e.g. sets the read thresholds) for a subsequent readout operation, at a readout configuration step 108. The subsequent readout operation may be performed on the same word line or on a different word line, as explained above. The memory controller then performs the subsequent readout operation using the defined configuration, at a subsequent readout step 118.

It will be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. An apparatus, comprising:
 a plurality of memory cells; and
 circuitry configured to:
  perform a first read operation on a first subset of the plurality of memory cells;
  determine a configuration dependent upon at least a portion of data retrieved during the first read operation; and
  perform a second read operation on a second subset of the plurality of memory cells dependent upon the configuration.

2. The apparatus of claim 1, wherein the second subset of the plurality of memory cells is different than the first subset of the plurality of memory cells.

3. The apparatus of claim 1, wherein the portion of the data retrieved during the first read operation includes information indicative of a programming status of one or more word lines.

4. The apparatus of claim 1, wherein to determine the configuration, the circuitry is further configured to select one or more read threshold values.

5. The apparatus of claim 3, wherein to determine the configuration, the circuitry is further configured to estimate interference dependent upon the programming status of the one or more word lines.

6. The apparatus of claim 5, wherein to perform the second read operation, the controller is further configured to cancel the interference.

7. A method, comprising:
 performing a first read operation on a first subset of a plurality of memory cells;
 determining a configuration dependent upon at least a portion of data retrieved during the first read operation; and
 performing a second read operation on a second subset of the plurality of memory cells dependent upon the configuration.

8. The method of claim 7, wherein the second subset of the plurality of memory cells is different than the first subset of the plurality of memory cells.

9. The method of claim 7, wherein the portion of the data retrieved during the first read operation includes information indicative of a programming status of one or more word lines.

10. The method of claim 7, wherein determining the configuration comprises selecting one or more read threshold values.

11. The method of claim 9, wherein determining the configuration comprises estimating interference dependent upon the programming status of the one or more word lines.

12. The method of claim 11, wherein performing the second read operation comprises cancelling the interference.

13. The method of claim 7, further comprising programming, in parallel, one or more memory cells of the plurality of memory cells coupled to a first word line, and at least one memory cell coupled to a second word line.

14. The method of claim 13, wherein programming the at least one memory cell coupled to the second word line comprises programming the at least one memory cell with data indicative of a programming status of the first word line.

15. A system, comprising:
 a memory device including a plurality of memory cells; and
 a controller configured to:
  receive memory access operations from a host;
  perform a first read operation on a first subset of the plurality of memory cells responsive to the receive memory access operations;
  determine a configuration dependent upon at least a portion of data retrieved during the first read operation; and
  perform a second read operation on a second subset of the plurality of memory cells dependent upon the configuration.

16. The system of claim 15, wherein the second subset of the plurality of memory cells is different than the first subset of the plurality of memory cells.

17. The system of claim 15, wherein the portion of the data retrieved during the first read operation includes information indicative of a programming status of one or more word lines.

18. The system of claim 15, wherein to determine the configuration, the controller is further configured to select one or more read threshold values.

19. The system of claim 17, wherein to determine the configuration, the controller is further configured to estimate interference dependent upon the programming status of the one or more word lines.

20. The system of claim 19, wherein to perform the second read operation, the controller is further configured to cancel the interference.

* * * * *